United States Patent [19]

Kaneko et al.

[11] Patent Number: 4,476,427
[45] Date of Patent: Oct. 9, 1984

[54] PULSE SIGNAL PROCESSING CIRCUIT HAVING A PROTECTION CIRCUIT AGAINST OVER-CURRENT BREAKDOWN

[75] Inventors: Takashi Kaneko; Masashi Shoji, both of Tokyo, Japan

[73] Assignee: Nippon Electric Company Ltd., Tokyo, Japan

[21] Appl. No.: 391,754

[22] Filed: Jun. 24, 1982

[30] Foreign Application Priority Data

Jun. 24, 1981 [JP] Japan ................................. 56-98018

[51] Int. Cl.$^3$ ............................................... G05F 1/10
[52] U.S. Cl. .................................... 323/234; 323/276;
361/87; 361/97; 363/55
[58] Field of Search .................. 323/234, 276; 361/18,
361/87, 97, 100, 101, 111; 363/55, 56, 41

[56] References Cited

U.S. PATENT DOCUMENTS 3,703,679 11/1972 Heidt ................................. 361/18 X
4,315,295 2/1982 Zocholl ........................... 361/97 X Primary Examiner—William M. Shoop
Attorney, Agent, or Firm—Sughrue, Mion, Zinn, Macpeak and Seas

[57] ABSTRACT

For protection of an output switching transistor used in a pulse signal output circuit, the present invention provides a first detector for detecting over-current flowing through the output switching element, a second detection circuit for producing a detection signal in response to detection of over-current by the first detector in excess of a predetermined rate, and a protection circuit protecting the output switching element by suppressing the current flowing therethrough in response to the detection signal. The protection circuit may suppress the current flowing through the output switching element by both the output of the over-current detector and the detection signal.

13 Claims, 13 Drawing Figures

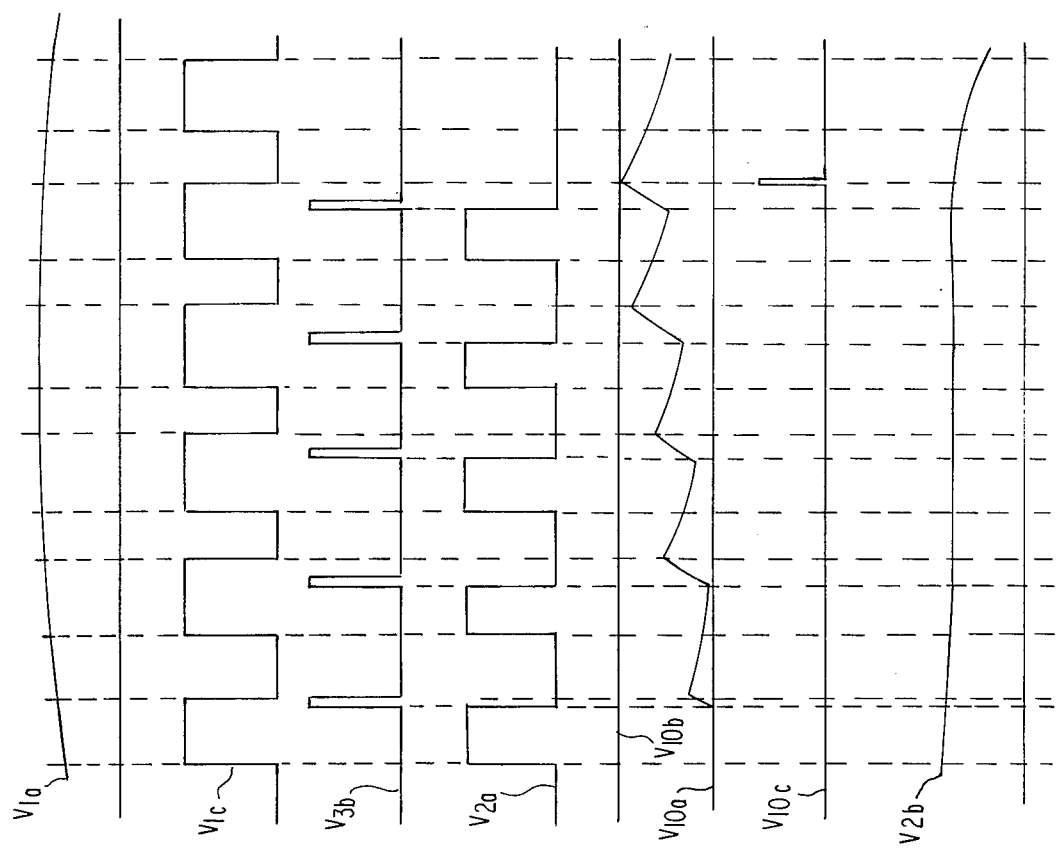
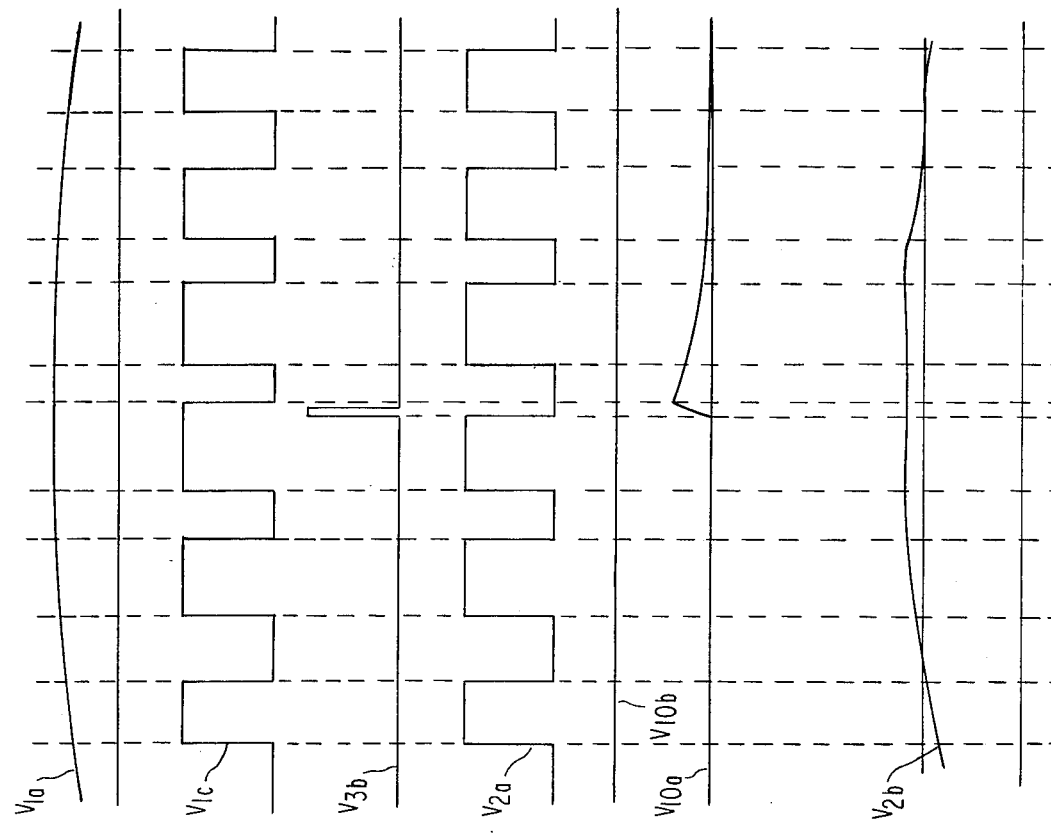

PULSE SIGNAL PROCESSING CIRCUIT HAVING A PROTECTION CIRCUIT AGAINST OVER-CURRENT BREAKDOWN

BACKGROUND OF THE INVENTION

This invention relates to a pulse signal processing circuit having an output switching element such as a transistor which is to be protected from an over-current breakdown. More particularly, the improvement is in the protection circuit of the output switching element.

Pulse signal processing circuits have been employed in pulse-width-controlled type switching regulators, pulse modulators, pulse amplifiers, pulse modulation type amplifiers and so on. In some of such pulse signal processing circuits of the prior art, a protection circuit has been provided to protect the output switching element or other element connected thereto from over-current breakdown. Some examples of such conventional apparatus are illustrated in FIGS. 1 and 2 in block form. The examples of FIGS. 1 and 2 each have an output section 2 having an output switching element and load. The output switching element is driven by an output 1c of a pulse-width modulator 1. The pulse width of the output 1c is controlled by the feed-back input 1b, i.e. the output 2b from the output section 2, in a case of a switching regulator, or by the input 1a applied from outside, in a case of a pulse amplifier, a pulse modulator or a pulse modulation type amplifier. Over-current of the output switching element is detected by the over-current detector 3.

The example shown in FIG. 1 applies the detection output 3b to the pulse-width modulator 1 to protect the output switching element by suppressing the output 1c. The other example shown in FIG. 2 interrupts the supply of the output 1c to the output section 2 by opening a switch 4 inserted between the pulse-width modulator 1 and the output section 2 in response to the detection output 3b.

The over-current detector 3 in the above-described conventional apparatus detects only when over-current flows through the output switching element. Thus, the output switching element can be protected only when over-current flows. This means that the output switching element continues its switching operation during some period when a situation causing over-current continues for an extended time. This situation occurs when the output of the output section 2 is directly grounded or when the output impedance changes to a value causing an oscillation in the output section 2. In such a situation, a current having a level which will be detected by the over-current detector 3 will continue to flow intermittently; this will cause the output switching element to deteriorate or break down. Further, such operation can lead to deterioration of the entire circuit.

SUMMARY OF THE INVENTION

The primary objective of the present invention is to provide a pulse signal processing circuit having an improved protection circuit.

Another objective of the present invention is to provide a pulse signal processing circuit having a protection circuit which protects an output switching element from breakdown when a situation causing an over-current flowing therethrough continues for an extended period.

According to the present invention, there is provided a pulse signal processing circuit including a pulse signal producing section, a switching element driven by the output from the pulse signal producing section, an over-current detector detecting over-current flowing through the switching element, a detection section producing a detection signal when the over-current detector detects the over-current more frequently than a predetermined rate and an output control section suppressing the current flowing through the switching element in response to the detection signal. Preferably, the pulse signal processing circuit further includes an auxiliary output control section suppressing the current flowing through the switching element in response to the over-current detection by the over-current detector.

According to the present invention, if the situation causing a flow of over-current through the switching element continues, the current flowing through the switching element is suppressed by the detection section and the output control section so as to protect the switching element from deterioration or breakdown. This protection effect may be made more efficient by driving the switching element into cut-off condition by the output control section. Further, if the auxiliary output control section is provided, the switching element may be also protected from sudden breakdown caused by momentary over-current.

BRIEF DESCRIPTION OF THE DRAWINGS

The above and other objects and features of the invention will become more apparent from the following description taken in conjunction with the accompanying drawings, wherein:

FIGS. 4(A) and 4(B) are signal waveform diagrams at various points of the preferred embodiment of the invention when an over-current flows momentarily and continuously, respectively;

DESCRIPTION OF THE PREFERRED EMBODIMENT

Figure 1:
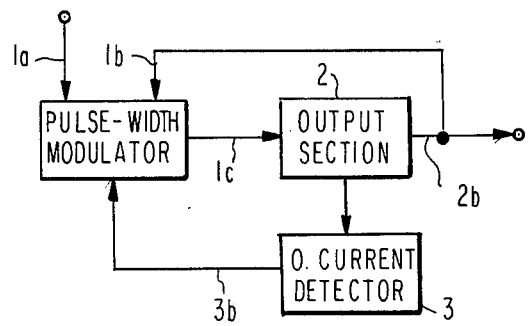
FIGS. 1 and 2 are block diagrams showing the conventional pulse-wave output circuits.
Figure 2:
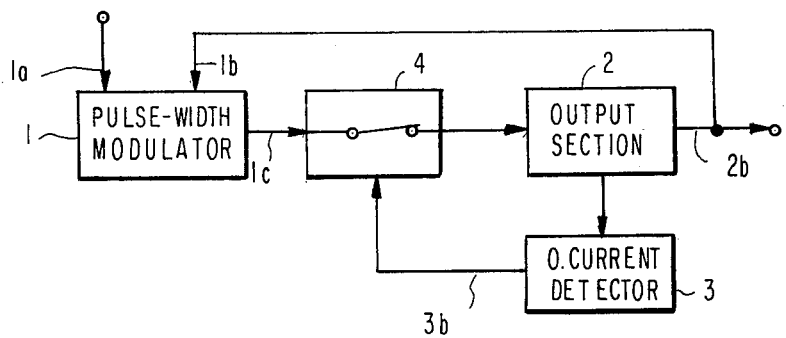
Figure 3:
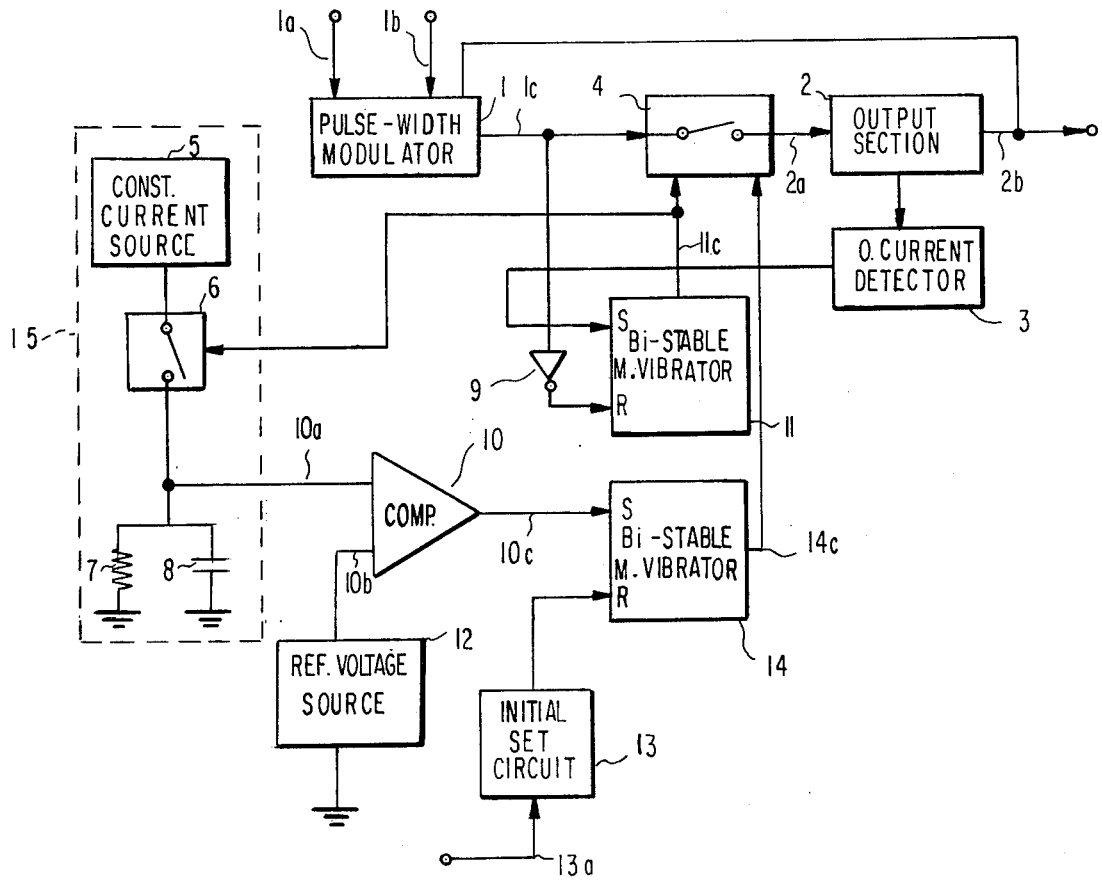
FIG. 3 is a block diagram showing a preferred embodiment of the present invention.

FIG. 3 showing the preferred embodiment of the present invention uses the same reference numerals as those in FIG. 2 to apply to corresponding elements. An output 1c from a pulse-width modulator 1 is applied to an output section 2 as its input 2a by way of a first switch 4. An input 1a or a feedback input 1b is selected as an input signal for the pulse-width modulator 1 in accordance with the function of the circuit. If the circuit is designed to operate as a switching regulator deriving a constant voltage, only feedback input 1b is selected, and the output signal 2b of the output section 2, which will be explained in detail later, is applied to the feedback input 1b as an input signal. On the other hand, if the circuit is designed as a pulse modulator or a pulse modulation type amplifier, input 1a is selected to apply an input signal to be modulated or amplified. In the latter case, it is possible to feed the feedback input 1b to achieve an automatic gain control in addition to the input 1a.

Figure 8:
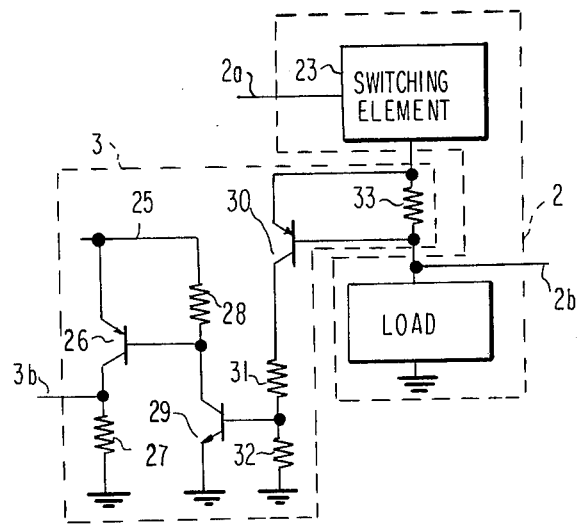
FIG. 8 is a block diagram of an example of overcurrent detector and output section.
Figure 9:
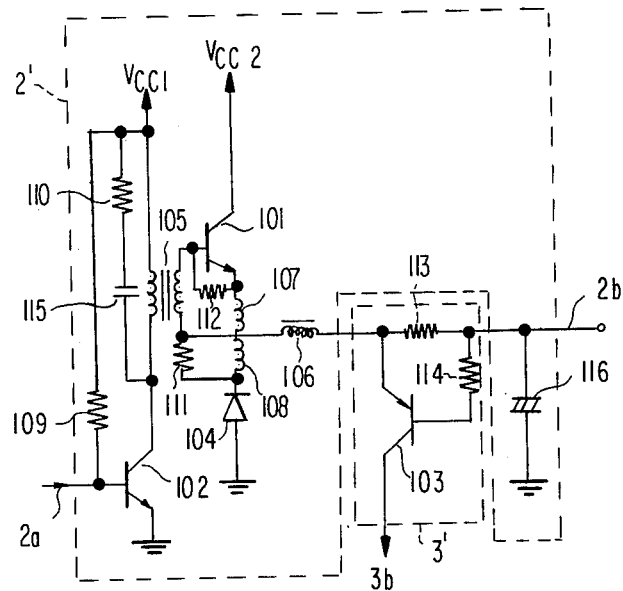
FIG. 9 is a circuit diagram of another example of over-current detector and output section.

The over-current detector 3 detects over-current flowing through an output switching transistor provided in the output section 2. As shown in FIGS. 8 and 9 which are explained later, the over-current may be detected by checking a voltage drop across a resistor inserted between the switching transistor and a load. The detection signal 3b of the overcurrent detector 3 is applied to the set terminal S of a bistable multivibrator 11. The bistable multivibrator 11 is reset by the output 1c applied to the reset terminal R through the inverter 9. In response to the set-state of the bistable multivibrator 11, the switch 4 is opened to cut off the output switching transistor in the output section 2. This is a first protection function which is effective against sudden breakdown due to momentary over-current.

Further, the preferred embodiment provides a continuous over-current detection circuit 15 in which charging of a capacitor 8 by a constant current source 5 or discharging of the same capacitor 8 through a resistor 7 is selected by a second switch 6. The second switch 6 is closed in response to the set state of the bistable multivibrator 11. The time constant of the parallel circuit of the resistor 7 and the capacitor 8 is selected so that the charge into the capacitor 8 during the set-state of the bistable multivibrator 11 may not be discharged completely during a pulse period of the output 1c. Therefore, when over-current is detected intermittently without a long interruption, the voltage across the capacitor 8 increases. This voltage across the capacitor 8 is applied to a comparator 10 through an input 10a to be compared with a reference voltage generated by a reference voltage source 12 and applied to the comparator 10 through an input 10b. When the set-state of the bistable multivibrator 11, i.e. the occurrence of over-current, reaches a predetermined rate of occurrence, the comparator 10 produces an output 10c. The output 10c of the comparator 10 is applied to the set terminal S of an additional bistable multivibrator 14 to set the multivibrator 14 when the voltage across the capacitor 8 is higher than the reference voltage. In response to the set-state of the multivibrator 14, the output 14c opens the first switch 4 to cut off the output switching transistor in the output section 2. The reset of the bistable multivibrator 14 is achieved by applying the output from an initial set circuit 13 to the reset terminal R. The initial set circuit 13 may be disigned so as to produce an output in response to resupply of power voltage or application of a reset signal 13a. The above operation is a second protection function which is effective against the breakdown occurring when a situation causing an over-current to the output switching transistor continues for a comparatively long time.

Now, the operation of the preferred embodiment of FIG. 3 used as a pulse modulation type amplifier will be explained by reference to the FIGS. 4(A) and 4(B). An input signal is pulse-modulated by the pulse-width modulator 1. After the pulse-modulated signal is amplified, the amplified pulse-modulated signal is demodulated into an amplified analog signal in the output section 2.

FIG. 4(A) illustrates an operation of the first protection function, when a momentary over-current flows through the output switching transistor in the output section 2.

An input signal $V_{1a}$ applied to the input 1a is pulse-modulated by the pulse-width modulator 1 to obtain an output signal $V_{1c}$ at the output 1c. The pulse width of the output signal $V_{1c}$ changes in accordance with the voltage level of the input signal $V_{1a}$. This output signal $V_{1c}$ is input to the output section 2 as its input signal $V_{2a}$ through the first switch 4 which is normally closed. The input signal $V_{2a}$ is amplified and demodulated in the output section 2 to produce an output signal $V_{2b}$ at the output 2b. To this end, the output section 2 provides a filter for demodulating the output of an output switching transistor.

Now, it is assumed that a momentary over-current flows through the output switching transistor by a momentary change in supply voltage or noise applied from the load. The over-current detector 3 produces a pulse $V_{3b}$ in response to the momentary over-current. This pulse sets the bistable multivibrator 11 to open the first switch 4. Because the set-state of the multivibrator 11 continues until the output signal $V_{1c}$ becomes low level, the level of the input signal $V_{2a}$ turns to low level by the pulse $V_{3b}$ and keeps its low level until the output $V_{1c}$ next becomes high level. Further, in response to the setstate of the multivibrator, the second switch 6 is closed to charge the capacitor 8. However, because the multivibrator 11 is soon reset, the voltage across the capacitor 8 does not rise to the reference voltage as shown as the signal $V_{10a}$. As a result, the output switch transistor is protected from breakdown and further output signal $V_{2b}$ is not deformed by the momentary over-current.

Next, under a condition which a situation which causes the over-current to continue for a comparatively long time, the operation of the embodiment including the second protection function will be explained by reference to FIG. 4(B).

In response to consecutive over-current conditions, pulses $V_{3b}$ occurs intermittently. Therefore, the pulse-width of the input signal $V_{2a}$ largely differs from the output signal $V_{1c}$. Accordingly, the output signal $V_{2b}$ no longer corresponds to the input signal $V_{1a}$. At this time, because the multivibrator 11 is set often, the second switch 6 is frequently closed to charge the capacitor 8. The time constant of the capacitor 8 and the resistor 7 is selected as to be longer than the duration of pulse in the output signal $V_{1c}$. The voltage across the capacitor 8 increases gradually, as shown as the signal $V_{10a}$. When the voltage of the signal $V_{10a}$ reaches the reference voltage $V_{10b}$ generated by the reference voltage source 12, the comparator 10 produces the output $V_{10c}$ to set the bistable multivibrator 14. In response to the output 10c, the first switch 4 is opened. Because the multivibrator 14 is not reset unless the power voltage is re-supplied or the special reset signal 13a is applied to the initial set circuit 13, the switch 4 keeps its open state. Thus after the voltage of the signal $V_{10a}$ reaches the reference voltage $V_{10b}$, the input signal $V_{2a}$ keeps its low level to lower the output signal $V_{2b}$ gradually as shown in FIG. 4(B).

As is apparent from FIG. 4(B), the output switching transistor continues its switching operation even under the condition where the situation causing the over-current continues. If the circuit does not provide the second protection function, the output transistor will deteriorate or break down. However, because the present invention provides the second protection function, the output transistor is efficiently protected from deterioration or breakdown.

As above mentioned, the second protection function of the above preferred embodiment does not operate as soon as the over-current is detected, but only after the over-current has been frequently detected. This is because over-current caused by momentary change in power supply voltage or noise applied to load is a sudden and very temporary phenomenon. Therefore, if the second protection function were to operate as soon as the temporary over-current occurred, although the circuit could operate normally after the temporary over-current, the circuit would not produce any output unless the operator reset the multivibrator 14. This reset operation is unnecessary in the preferred embodiment.

It is noted here that the same effect is obtained by a modification wherein two switches operated respectively by the outputs of the multivibrators 11 and 14 are serially connected in place of a single switch 4.

Further, in the case where the output switching transistor turns on by the low level of the input signal $V_{2a}$, the output signal $V_{1c}$ may apply directly to the reset terminal R of the multivibrator 11.

Figure 5:
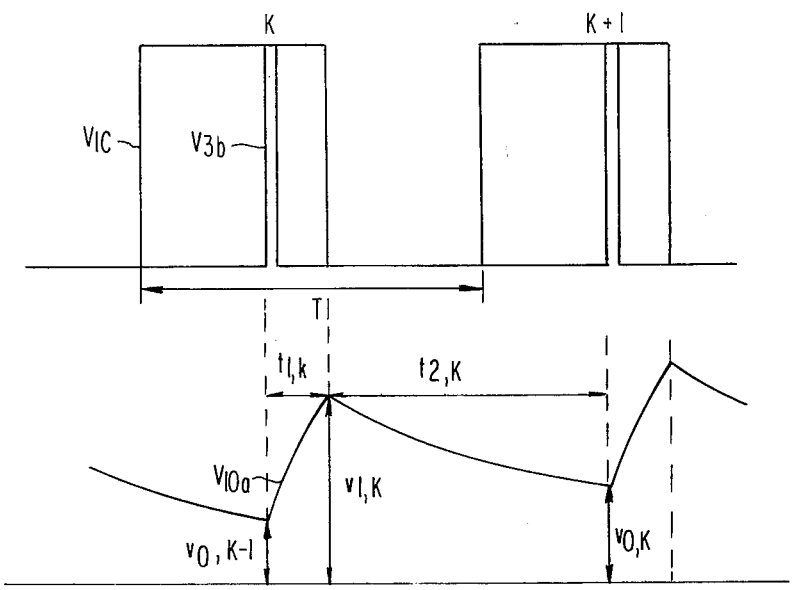
FIG. 5 is a waveform diagram showing a relationship between over-current detection and increasing voltage of a capacitor in a continuously over-current detection circuit.

Now, description will be made, with reference to FIG. 5, to the relation between the absolute values of the current I of the constant current circuit 5, the resistance R of the resistor 7, the capacitance C of the capacitor 8 and the time elapsed from the first detection of an over-current until the output disappears. It is assumed that, upon the k-th detection counting from the first detection of the over-current, the signal $V_{10a}$ at the input 10a is represented as shown in FIG. 5. More specifically, the voltage at the beginning of the k-th detection is $V_{0, k-1}$, the charging time to the capacitor 8 is $t_{1, k}$, and the voltage at the end of the k-th detection is $V_{1, k}$. The discharging time following the charging time is $t_{2, k}$, and the voltage at the end of the discharging time is $V_{0, k}$.

At first, from the condition that the voltage of the signal $V_{10a}$ exceeds the reference voltage $V_{10b}$ (hereinafter referred as $V_R$), the following formula 1 must be fulfilled.

$$R \times I \geq V_R \qquad \qquad 1$$

The crest values of the signal $V_{10a}$ upon the first and the k-th detection are given by the following equations 2 and 3.

$$V_{1,1} = R \cdot I \left(1 - e^{\frac{-t_{1,1}}{CR}}\right) \qquad \qquad 2$$

$$V_{1,k} = R \cdot I \cdot \sum_{i=1}^{k} \left\{ \left(1 - e^{\frac{-t_{1,i}}{CR}}\right) \cdot \frac{k-1}{l=i} e^{\frac{-t_{2,1}}{CR}} \right\} \qquad 3$$

Further, the value of the signal $V_{10a}$ at the end of the k-th discharging time is as follows.

$$\left[\text{Where } \frac{k-1}{l=i} = 0 \; (l > k-1) \text{ and } k \neq 1.\right]$$

$$V_{0,k} = V_{1,k} \cdot e^{\frac{-t_{2,k}}{CR}} \qquad \qquad 4$$

Here, for the sake of simplicity, the following conditions 5 and 6 are assumed.

$$t_{1,1} = t_{1,2} = t_{1,3} = \ldots = t_{1,k} = \ldots \qquad \qquad 5$$

$$t_{2,1} = t_{2,2} = t_{2,3} = \ldots = t_{2,k} = \ldots \qquad \qquad 6$$

Figure 6:
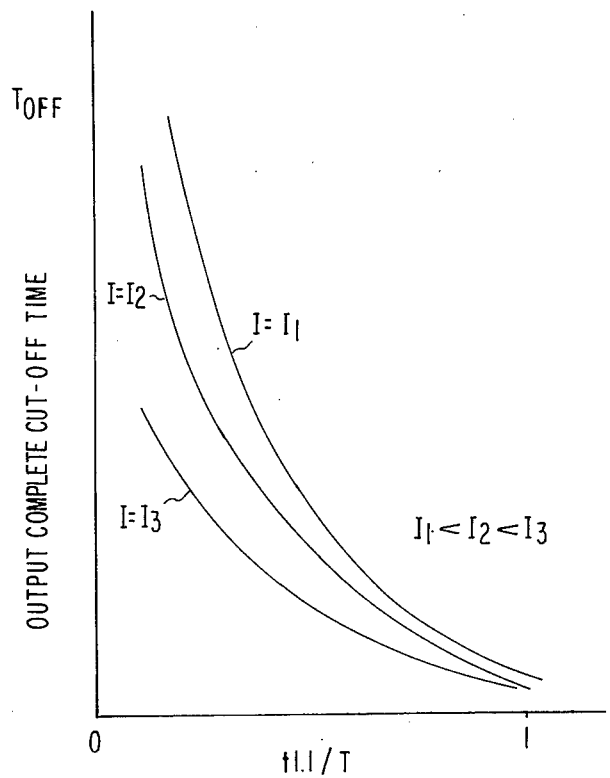
FIG. 6 is a diagram showing a relationship between a ratio of first bistable multivibrator set time and a signal pulse duration and a time elapsing until the output transistor is cut-off completely.

If $T_{off}$ is assumed as the time elapsed from the first detection of an over-current until the crest value of the formula 3 becomes higher than the reference voltage $V_R$ and thereby the multivibrator 14 is set, the relationship between the time $T_{off}$ and the ratio ($t_{1,1}/T$) of the time $t_{1,1}$ to the pulse period T is as shown in FIG. 6. The large value of the ratio $t_{1,1}/T$ means that the degree of anomaly is severe, because the over-current is detected early to make the ratio $t_{1,1}/T$ large when the over-current is large. The diagram of FIG. 6 shows that the larger the over-current is, the shorter the time $T_{off}$ is. This relation is suitable for effective protection of the output switching transistor.

Upon selection of the values of the constant current value I, the resistance R, the capacitance C and the reference voltage $V_R$, so far as the formula 1 is fulfilled, they may be selected to meet the desired time $T_{off}$ with reference to FIG. 6. This enables large freedom in the circuit design. As a one example, the constant current of the constant currence source 5, the capacitance of the capacitor 8, the resistance of the resistor 7 and the reference voltage generated by the reference voltage source 12 may be respectively selected as 500 $\mu$A, 0.033 $\mu$F, 100 k$\Omega$ and 2.8 V.

In addition, with regard to a temperature dependence of the time $T_{off}$, the preferred embodiment shown in FIG. 3 may easily be designed by usual circuit design techniques so that the time $T_{off}$ may be free from the temperature change or may be shortened in accordance with increase of the temperature.

Figure 7:
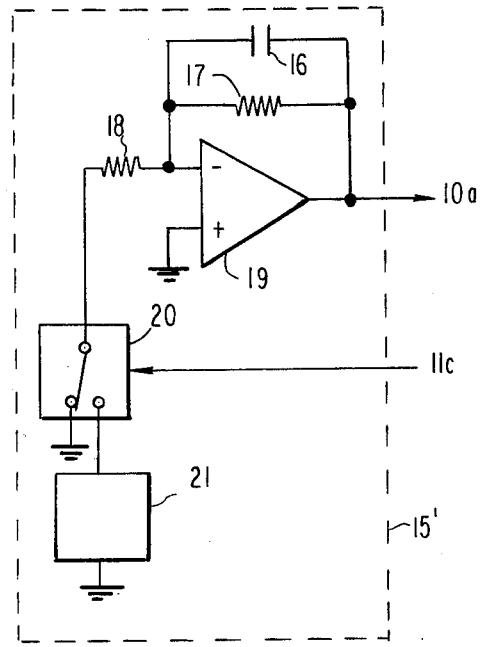
FIG. 7 is a block diagram of another example of the continuous over-current detection circuit.

FIG. 7 shows another example 15' of the continuous over-current detection circuit 15 in FIG. 3. An integrator consisting of an operational amplifier 19, a capacitor 16, and resistors 17 and 18 is combined with a switch 20 and a constant voltage source 21. An output is derived from the output of the operational amplifier 19 and applied to the input 10a of the comparator 10 (FIG. 3). The switch 20 connects the resistor 18 to the constant voltage source 21 in response to the set-state of the multivibrator 11 and to the ground in response to the reset state. It is to be noted that, if the resistance $R_{17}$ of the resistor 17, the resistance $R_{18}$ of the resistor 18, the capacitance $C_{16}$ of the capacitor 16 and the constant voltage $V_{const}$ of the constant voltage source 21 meet the relation of the formulas 7 and 8, the operation of the continuous overcurrent detection circuit 15' is considered the same as the circuit 15.

$$\frac{R_1}{R_2} \cdot V > V_R \qquad 7$$

$$R_1 = R \qquad 8$$

FIG. 8 is an example of the output section 2 and the over-current detection circuit 3 in FIG. 3. When a current is supplied to the load 24 by turning the output switching transistor 23 on by the input 2a, a resistor 33 produces a voltage drop. If the voltage drop across the resistor 33 exceeds the base-emitter forward voltage $V_{BE(ON)}$ of a transistor 30, the transistor 30 turns on as a result of over-current detection to supply a current to a transistor 29 through a resistor 31. As soon as the transistor 29 turns on, the transistor 26 turns on to produce a high level output of the over-current detection signal 3b as a detection signal of the over-current. On the other hand, when the voltage drop across the resistor 33 is smaller than the base-emitter voltage $V_{BE(ON)}$ of the transistor 30, all the transistors 30, 29 and 26 turn off to produce a low level output of the over-current detection signal 3b.

As another embodiment, the resistor 33 may be replaced with a primary winding of a transformer. The secondary winding is serially connected with a resistor. The voltage drop across the resistor is compared with a reference voltage to detect an over-current of the output switching transistor 23.

FIG. 9 is an example of the output section 2′ and the over-current detection circuit 3′ which is applicable to a switching regulator. A transistor 101 forms an output switching transistor. A choking coil 106 and a capacitor 116 form a load. In one example, the capacitance of the capacitor 116 and the inductance of the choking coil 106 are preferably selected as 33 µF and 5.6 mH, respectively. The input 2a makes the transistor 102 turn on and off to apply pulses to a transformer 105. The transistor 101 turns on and off by the output of the transformer 105. The emitter output current of the transistor 101 applied to a low pass filter composed of the choking coil 106 and the capacitor 116 to produce a D.C. voltage at the output 2b. This D.C. voltage at the output 2b is applied to the feedback input 1b (FIG. 3). It is noted that the input 1a (FIG. 3) is not required.

A resistor 113 is inserted between the choking coil 106 and the capacitor 116 to detect an over-current flowing through the transistor 101. When the voltage drop across the resistor 113 exceeds the base-emitter forward voltage $V_{BE(ON)}$ of the transistor 103 and the voltage drop across the resistor 114, the transistor 103 turns on to produce an over-current detection signal 3b. However, since the signal level of the detection signal 3b is unstable, it is preferable to apply this detection signal 3b to a circuit for stabilizing the signal level such as a circuit composed of transistors 26, 28 and 29 and resistors 27, 28, 31 and 32 of FIG. 8. It is a matter of course that the positions of the choking coil 106 and the resistor 113 are interchangeable.

Figure 10:
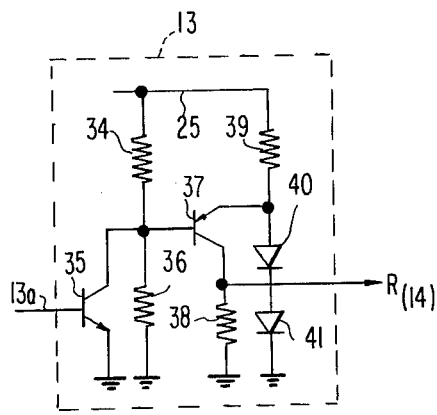
FIG. 10 is a circuit diagram of an example of initial set circuit.

FIG. 10 shows an example of the initial set circuit 13. It is assumed that a current (the reset signal 13a) is not supplied to the base of a transistor 35. Namely, the transistor 35 is off-state so that the voltage at its collector is determined by only relation of the resistance values $R_{34}$ and $R_{36}$ of the resistors 34 and 36. Further, power voltage at a power line 25, voltage difference of diodes 40 and 41 and the base-emitter forward voltage of the transistor 37 are represented respectively as $V_{CC}$, $V_D$, and $V_{BE37(ON)}$. Under these assumptions, the output R is high-level when the following formula 9 is fulfilled.

$$2V_D - \frac{R_{36}}{R_{34} + R_{36}} \cdot V_{CC} \geqq V_{BE37(ON)} \qquad 9$$

This is because the transistor 37 turns on to supply current to the resistor 38 through the resistor 39 and the transistor 37.

On the contrary, when the formula 10 is fulfilled, the transistor 37 turns off to produce a low level signal as the output R.

$$2V_D - \frac{R_{36}}{R_{34} + R_{36}} \cdot V_{CC} < V_{BE37(ON)} \qquad 10$$

For simplicity, the base-emitter forward voltage $V_{BE37(ON)}$ is considered as equal to $V_D$. The formulas 9 and 10 can be expressed as the formulas 11 and 12, respectively.

$$0 \leqq V_{CC} \leqq \left(1 + \frac{R_{34}}{R_{36}}\right) V_D \qquad 11$$

$$\left(1 + \frac{R_{34}}{R_{36}}\right) \cdot V_D \leqq V_{CC} \leqq V_{CC(steady)} \qquad 12$$

where $V_{CC(steady)}$ is a power voltage at a steady state.

After the power switch is put on, the power voltage $V_{CC}$ rises from 0 to $V_{CC(steady)}$ gradually. Therefore, the formula 11 is first fulfilled to produce a high level signal as the output R. This high level of the output R resets the multivibrator 14 (FIG. 3). Thereafter, the formula 12 is fulfilled to produce a low level signal as the output R. This condition continues so long as the multivibrator 14 is set by the continuous over-current.

The reset of the multivibrator may be made by the reset signal 13a. It is assumed that the voltage $V_{CC}$ is the steady state voltage $V_{CC(steady)}$. When the reset signal 13a of high level is applied to the transistor 35, the transistor 35 turns on to lower the voltage at the collector thereof. As a result, the transistor 37 turns on to produce a high level output R which reset the multivibrator 14.

Here, it is to be noted that, while the initial set circuit 13 of FIG. 10 uses two diodes 40 and 41 connected in series, the number n of the serially connected diodes may be arbitrarily selected so long as the following formula 13 is fulfilled.

$$0 < \left(1 + \frac{R_{34}}{R_{36}}\right)(n \cdot V_D - V_{BE37(ON)}) < V_{CC(steady)} \qquad 13$$

Figure 11:
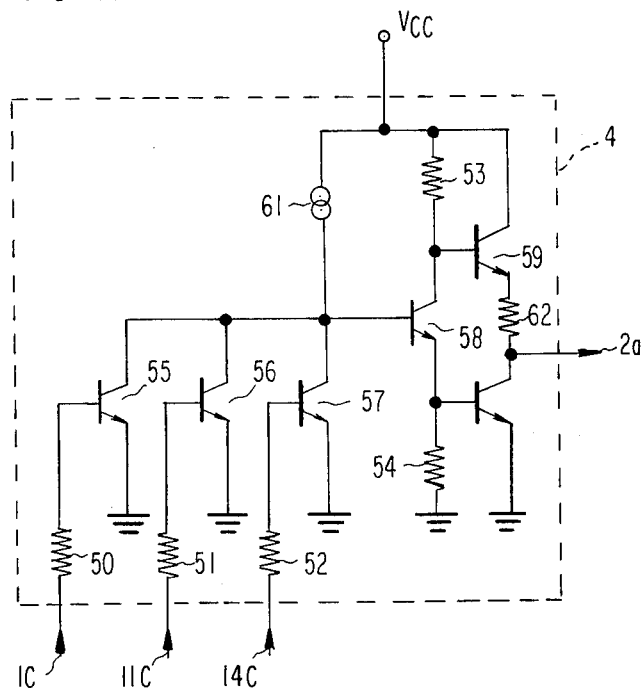
FIG. 11 is a circuit diagram of an example of a first switch.

FIG. 11 is an example of the first switch 4 of FIG. 3. Transistors 55, 56 and 57 and constant current source 61 constitute a three-input NOR circuit. The output of this NOR circuit is applied to base of a transistor 58 which constitutes a single-ended push-pull output stage together with transistors 59 and 60 and resistors 53, 54 and 62.

The output 11c of the multivibrator 11 and the output 14c of the multivibrator 14 are applied, respectively, to the base of transistor 56 through a resistor 51 and to the base of transistor 57 through a resistor 52. The output 1c from the pulse-width modulator 1 is applied to base of the transistor 55 through a resistor 50. Therefore, when the outputs 11c and 14c are low-level (i.e. the multivibrators 11 and 14 are resetstate), the output 1c is transmitted to the transistor 58, after inversion by the transistor 55, and then derived as the output 2a of the output section 2. Since the single-ended push-pull output stage is an inverting amplifier, the phase of the input 2a is the same as the output 1c. On the contrary, when at least one of the outputs 11c and 14c are high-level, the corresponding transistor 56 and/or 57 becomes conductive to turn the transistor 58 off irrespective of the output 1c. As a consequence, a high-level output is obtained as the input 2a.

Thus, when, as a result of over-current detection, at least one of the multivibrators 11 and 14 is set, the first switch 4 does not transmit the output 1c to the output section 2. When none of the multivibrators 11 and 14 is set, the first switch 4 transmits the output 1c to the output section 2. However, when the above example of the first switch 4 is adopted, the output switching transistor in the output section 2 must be designed to turn off in response to the high-level of the input 2a.

Figure 12:
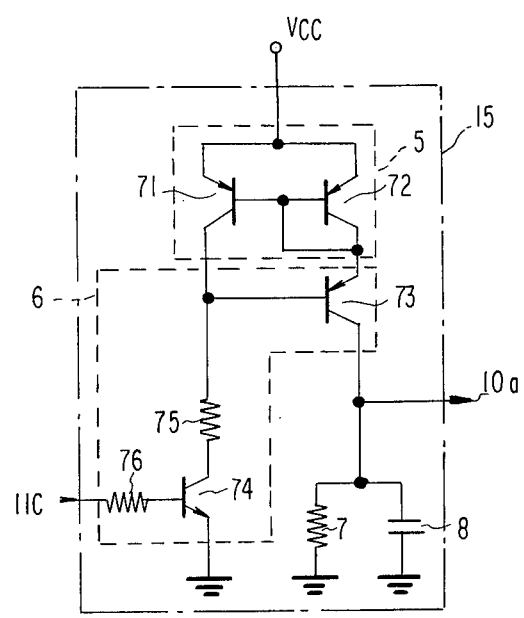
FIG. 12 is a circuit diagram of an example of the continuous over-current detection circuit shown in FIG. 3 in block diagram.

FIG. 12 is an example of the continuous over-current detection circuit 15. This circuit 15 comprises the constant current source 5 having a transistor 71 and a diode-connected transistor 72, the second switch 6 having transistors 73 and 74 and resistors 75 and 76, the resistor 7 operating as a discharging path and the capacitor 8 as a charging medium.

When the multivibrator 11 is set, its high-level output is applied to base of the transistor 74 through the resistor 76 to turn the transistor 74 on. As a consequence, the transistor 74 activates the constant current source 5 of current-mirror type and turns the transistor 73 on to charge the capacitor 8. When the multivibrator 11 is reset, the transistor 74 keeps its cut-off condition to turn all other transistors 71, 72 and 73 off. Therefore, charges in the capacitor 8 discharge through the resistor 7. The voltage across the capacitor 8 is derived from the connection between the transistor 73, the resistor 7 and the capacitor 8 as the input 10a of the comparator 10 (FIG. 3).

As mentioned above, according to the present invention, by the operation of the second protection function, the output switching element is protected from deterioration or breakdown caused by frequent or continuous over-current flowing therethrough. The starting time point of the second protection function may be adjustable by controlling the charging and/or discharging current value in accordance with the ability of the output switching element, frequency of over-current, and current value of the over-current. Further, by the operation of the first protection function, the output switching element is also protected from the deterioration or the breakdown caused by sudden and momentary over-current. This first protection function resets automatically the whole circuit to initial state without operator action.

Thus, the present invention achieves complete and easy protection of the output switching element. While the invention has been described with respect to specific embodiments, it will be recognized by those of skill in the art that many modifications and alternative embodiments may be made.

What is claimed is:
1. A pulse signal producing circuit comprising:

a means for producing a pulse;
an output switching element applied with said pulse and producing an output current in response to said applied pulse;
a first means for generating a first detection signal when said output current is larger than a predetermined value, said first detection signal disappearing before the next pulse is applied to said output switching element;
a second means coupled between said pulse producing means and said output switch element for operatively interrupting the application of said pulse to said output switching element;
a third means for applying said first detection signal to said second means to enable said second means every time said first detection signal is generated;
a fourth means for generating a second detection signal when the rate of occurrence of said first detection signal exceeds a predetermined rate, and for thereafter continuing to generate said second detection signal irrespective of said pulse;
a fifth means for applying said second detection signal to said second means to stop the application of said pulse to said output switching element; and
a sixth means for resetting said fourth means to terminate said second detection signal.

2. A pulse signal processing circuit as claimed in claim 1, wherein said pulse producing means comprises an input terminal receiving an input signal, a pulse-width modulator producing said pulse having a pulse-width corresponding to said input signal, and an output terminal supplying said pulse to said output switching element.

3. A pulse signal processing circuit as claimed in claim 1 or 2, wherein said fourth means comprises a capacitor, means for charging said capacitor when said first means produces said first detection signal, means for discharging said capacitor when said first means does not produce said first detection signal, a reference voltage generator, and a comparator comparing the voltage across said capacitor with said reference voltage.

4. A pulse signal processing circuit as claimed in claim 3, wherein said fourth means further comprises a bistable multivibrator which is set by the output from said comparator, the output of said bistable multivibrator being applied to said second means for stopping the current flowing through said output switching element.

5. A pulse signal processing circuit comprising:
an output section including an output switching transistor;
means for supplying a pulse signal to said output section, said output switching transistor producing an output current for a time duration of said pulse signal;
an over-current detector for detecting that said output current is larger than a predetermined value, said over-current detector producing a first detection signal as a result of the detection and being automatically reset after said first detection signal is produced;
means for temporarily stopping said output current in response to said first detection signal;
detecting means for detecting that said first detection signal occurs frequently, said detecting means producing a second detection signal as a result of said frequency detection of said first detection signal, said second detection signal being thereafter continued irrespective of said pulse signal; and means for continuously stopping said output current in response to said second detection signal.

6. A pulse signal processing circuit as claimed in claim 5, wherein said over-current detector is reset by the next pulse of said pulse signal after said over-current detector produces said first detection signal.

7. A pulse signal processing circuit as claimed in claim 6, further comprising an initial set circuit for re-setting said detecting means after said detecting means produces said second signal.

8. A pulse signal processing circuit as claimed in claim 7, wherein said initial set circuit resets said detecting means in response to a re-supply of power voltage to said initial set circuit.

9. A pulse signal processing circuit as claimed in claim 7, wherein said initial set circuit resets said detecting means in response to an application of a reset signal to said initial set circuit.

10. A pulse signal processing circuit as claimed in claim 5, 6, 7, 8 or 9, wherein said detecting means comprises a capacitive element, means for charging said capacitive element in response to said first detection signal, means for discharging said capacitive element in response to the absence of said first detection signal, a reference voltage source producing a reference voltage, and means for comparing the voltage across said capacitive element with said reference voltage.

11. A pulse signal processing circuit as claimed in claim 5, wherein said pulse signal supplying means comprises an input terminal receiving an input signal, and a pulse-width modulator modulating said input signal.

12. A pulse signal processing circuit as claimed in claim 11, wherein said output section further comprises a filter for converting the output from said output switching transistor into an analog signal.

13. A pulse signal processing circuit claimed in claim 12, wherein said analog signal is applied to said input terminal as said input signal.

* * * * *

UNITED STATES PATENT AND TRADEMARK OFFICE
CERTIFICATE OF CORRECTION

PATENT NO. : 4,476,427

DATED : Oct. 9, 1984

INVENTOR(S) : Takashi KANEKO; Masashi SHOJI

It is certified that error appears in the above-identified patent and that said Letters Patent is hereby corrected as shown below:

Column 3, line 62, "disigned" should be --designed--.

Column 9, line 7, change "output" (first occurrence) to --input--.
line 68, "producing" should be --processing--.

Column 10, line 11, "switch" should be --switching--.

Signed and Sealed this

Sixteenth Day of July 1985

[SEAL]

Attest:

DONALD J. QUIGG

*Attesting Officer*     Acting Commissioner of Patents and Trademarks